(12) United States Patent
Jeong et al.

(10) Patent No.: US 11,733,303 B2
(45) Date of Patent: Aug. 22, 2023

(54) METHOD FOR DETECTING AND CONTROLLING BATTERY STATUS BY USING SENSOR, AND ELECTRONIC DEVICE USING SAME

(71) Applicant: Samsung Electronics Co., Ltd., Gyeonggi-do (KR)

(72) Inventors: Dae Ung Jeong, Gyeonggi-do (KR); Seung Goo Lee, Gyeonggi-do (KR); Dong Uk Kwak, Gyeonggi-do (KR); Min Ho Park, Gyeonggi-do (KR); Hyun Cheol Park, Gyeonggi-do (KR); Sung Gun Bae, Gyeonggi-do (KR); Ik Joo Byun, Gyeonggi-do (KR); Seung Eun Lee, Gyeonggi-do (KR)

(73) Assignee: Samsung Electronics Co., Ltd

( * ) Notice: Subject to any disclaimer, the term of this patent is extended or adjusted under 35 U.S.C. 154(b) by 527 days.

(21) Appl. No.: 16/959,618

(22) PCT Filed: Nov. 14, 2018

(86) PCT No.: PCT/KR2018/013931
§ 371 (c)(1),
(2) Date: Jul. 1, 2020

(87) PCT Pub. No.: WO2019/135486
PCT Pub. Date: Jul. 11, 2019

(65) Prior Publication Data
US 2020/0386816 A1 Dec. 10, 2020

(30) Foreign Application Priority Data
Jan. 2, 2018 (KR) .......... 10-2018-0000260

(51) Int. Cl.
*G01R 31/367* (2019.01)
*G01R 31/382* (2019.01)
(Continued)

(52) U.S. Cl.
CPC ....... *G01R 31/367* (2019.01); *G01R 31/2872* (2013.01); *G01R 31/382* (2019.01);
(Continued)

(58) Field of Classification Search
CPC .. G01R 31/367; G01R 31/392; G01R 31/396; G01R 31/382; G01R 31/2872; H01M 10/48
(Continued)

(56) References Cited

U.S. PATENT DOCUMENTS

2007/0229294 A1 10/2007 Vossmeyer et al.
2010/0273081 A1 10/2010 Ishikawa
(Continued)

FOREIGN PATENT DOCUMENTS

| CN | 101971400 | 2/2011 |
|---|---|---|
| CN | 202661451 | 1/2013 |

(Continued)

OTHER PUBLICATIONS

Chinese Office Action dated Jul. 21, 2021 issued in counterpart application No. 201880085400.3, 26 pages.
(Continued)

*Primary Examiner* — Vincent Q Nguyen
*Assistant Examiner* — Trung Q Nguyen
(74) *Attorney, Agent, or Firm* — The Farrell Law Firm, P.C.

(57) ABSTRACT

Various embodiments of the present invention relate to a method for detecting and controlling a battery status by using a sensor, and an electronic device using the same, the electronic device comprising: a housing; an accommodation part arranged inside the housing and including at least one gas sensor; a battery arranged inside the housing; a memory for storing information, acquired by the at least one gas sensor, on gas leaked from the battery and operation control (Continued)

information of the electronic device; and a processor electrically connected to the memory, wherein the processor is configured to acquire a detection signal of gas leaked from the battery by using the at least one gas sensor, and control the operation of at least a part of the electronic device and/or charging characteristics of the battery when the acquired gas detection signal exceeds a predetermined threshold value, so as to detect, in real time, a gas leakage of the battery occurring because of the exposure of the electronic device to high temperature or heat generation and control the battery status, thereby preventing safety accidents caused by the battery. Other various embodiments in addition to the disclosed various embodiments in the present invention are possible.

14 Claims, 18 Drawing Sheets

(51) Int. Cl.
    *H01M 10/48*     (2006.01)
    *G01R 31/392*     (2019.01)
    *G01R 31/396*     (2019.01)
    *G01R 31/28*     (2006.01)

(52) U.S. Cl.
    CPC ......... *G01R 31/392* (2019.01); *G01R 31/396* (2019.01); *H01M 10/48* (2013.01)

(58) Field of Classification Search
    USPC .................................................. 324/323–346
    See application file for complete search history.

(56) References Cited

U.S. PATENT DOCUMENTS

| | | | |
|---|---|---|---|
| 2014/0091811 A1* | 4/2014 | Potyrailo | G06K 19/0717 |
| | | | 324/602 |
| 2014/0174150 A1 | 6/2014 | Yajima | |
| 2015/0219608 A1 | 8/2015 | Choi et al. | |
| 2015/0226585 A1 | 8/2015 | Yang | |
| 2017/0212100 A1 | 7/2017 | Kwak et al. | |

FOREIGN PATENT DOCUMENTS

| | | | | |
|---|---|---|---|---|
| CN | 202661451 U | * | 9/2013 | ............. G01D 21/02 |
| CN | 103900767 | | 7/2014 | |
| CN | 204461695 | | 7/2015 | |
| CN | 205280906 | | 6/2016 | |
| CN | 206480725 | | 9/2017 | |
| EP | 1 841 002 | | 10/2007 | |
| EP | 2 905 673 | | 8/2015 | |
| JP | 2011-102727 | | 5/2011 | |
| KR | 101583373 | | 1/2016 | |
| KR | 1020160020759 | | 2/2016 | |
| KR | 1020160047200 | | 5/2016 | |
| KR | 1020170088685 | | 8/2017 | |

OTHER PUBLICATIONS

Chinese Office Action dated Mar. 2, 2022 issued in counterpart application No. 201880085400.3, 8 pages.
PCT/ISA/210 Search Report issued on PCT/KR2018/013931, dated Feb. 25, 2019, pp. 5.
PCT/ISA/237 Written Opinion issued on PCT/KR2018/013931, dated Feb. 25, 2019, pp. 7.
European Search Report dated Nov. 6, 2020 issued in counterpart application No. 18897906.6-1216, 9 pages.

* cited by examiner

METHOD FOR DETECTING AND CONTROLLING BATTERY STATUS BY USING SENSOR, AND ELECTRONIC DEVICE USING SAME

PRIORITY

This application is a National Phase Entry of PCT International Application No. PCT/KR2018/013931 which was filed on Nov. 14, 2018, and claims priority to Korean Patent Application No. 10-2018-0000260, which was filed on Jan. 2, 2018, the content of each of which is incorporated herein by reference.

TECHNICAL FIELD

Embodiments of the disclosure relate to a method for detecting and controlling a battery status by using a sensor, and an electronic device using the same.

BACKGROUND ART

Electronic devices such as a smartphone, a tablet, and a wearable device are increasingly used.

Portable electronic devices can provide various functions such as a telephone call, photographing, playback of motion pictures, and games.

Portable electronic devices may have a battery that supplies power to be able to perform these various functions.

DETAILED DESCRIPTION OF INVENTION

Technical Problem

As such portable electronic devices perform various functions, issues about the capacity, boosting charge, etc. of a battery are considered as important matters.

Batteries may have different kind and environment characteristics in accordance with the purposes for use thereof.

Batteries may produce gas or may be broken due to dissolution of an electrolyte by overcharging, exposure to high temperature, an internal short, etc.

Various embodiments of the disclosure can provide a method and electronic device that can detect gas produced from a battery and can control the status of the battery, using a sensor.

Various embodiments of the disclosure can provide a method and electronic device that can discharge gas produced from a battery to the outside of the electronic device.

Solution to Problem

An electronic device according to various embodiments of the disclosure includes: a housing; an accommodator disposed in the housing and including at least one gas sensor; a battery disposed in the housing; a memory configured to store information of gas, which leaks from the battery, sensed by the at least one gas sensor and operation control information of the electronic device; and a processor electrically connected with the memory, in which the processor may be configured to obtain a sensing signal of the gas leaking from the battery using the at least one gas sensor, and control at least some operations of the electronic device and/or a charging characteristic of the battery when the obtained gas sensing signal exceeds a predetermined threshold.

An electronic device according to various embodiments of the disclosure includes: a housing; an accommodator disposed in the housing and including at least one gas sensor; and a battery disposed in the housing, in which the accommodator including the at least one gas sensor may have a first hole formed in a first direction and a second hole formed in a second direction; the first hole may be disposed at a position corresponding to a hole formed at the housing; the second hole may be disposed at a position corresponding to a hole formed at the battery; and the at least one gas sensor may be configured to sense gas leaking from the hole of the battery and flowing inside through the second hole.

A method for sensing and controlling a status of a battery using a sensor according to various embodiments of the disclosure may include: obtaining a sensing signal of gas leaking from the battery using at least one gas sensor by means of a processor of the electronic device; and controlling some operations of the electronic device and/or a charging characteristic of the battery when the obtained sensing signal of the gas exceeds a predetermined threshold.

Advantageous Effects of Invention

According to various embodiments of the disclosure, the electronic device senses in real time gas leakage from the battery due to exposure to high temperature of heat generation and controls the status of the battery, thereby being able to prevent an accident due to the battery.

According to various embodiments of the disclosure, it is possible to secure stability of the battery that is used in an electronic device by discharging gas produced from the battery to the outside of the electronic device.

MODE FOR THE INVENTION

Figure 1:
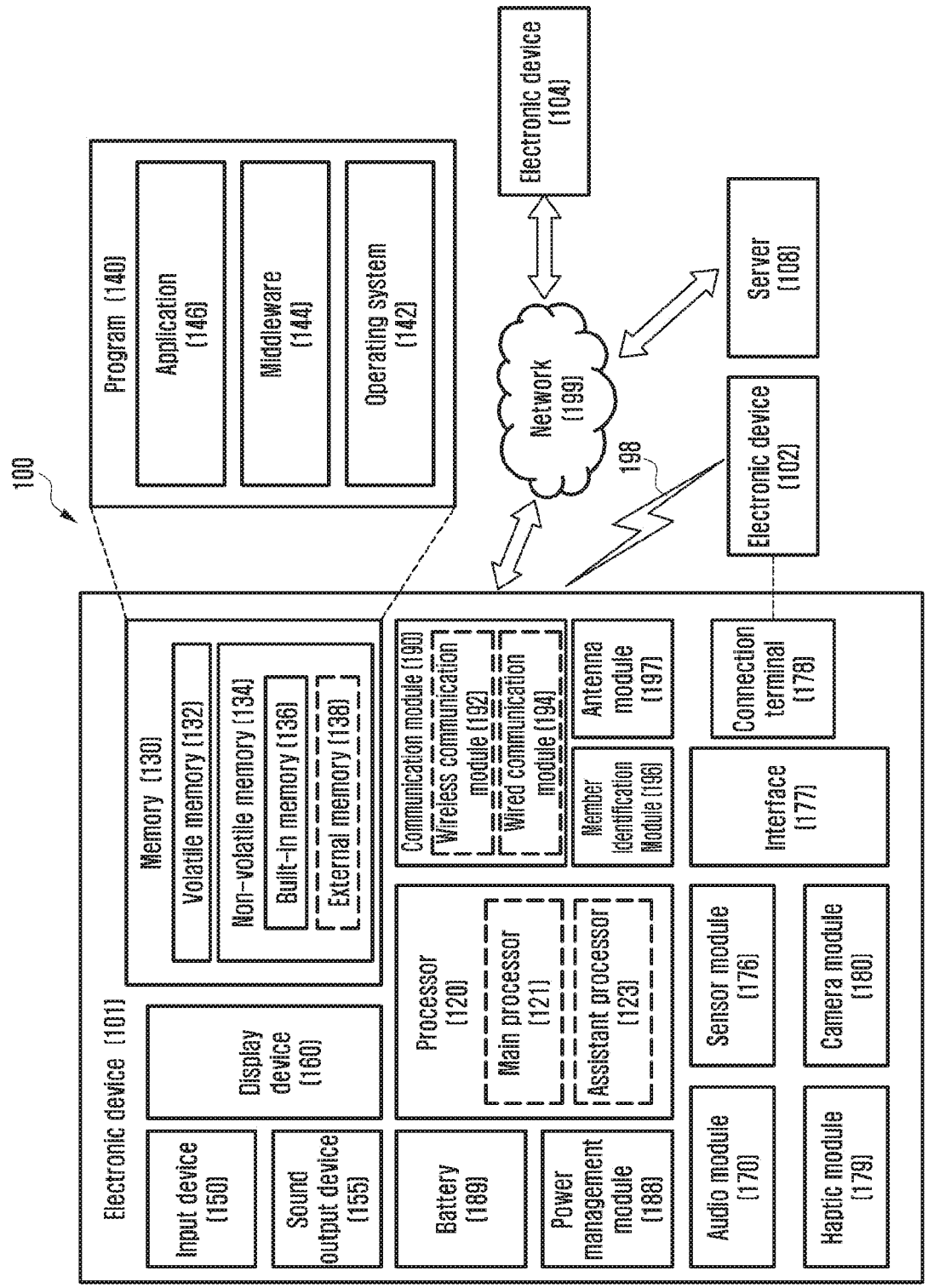
FIG. 1 is a block diagram of an electronic device in a network environment according to various embodiments of the disclosure.

FIG. 1 is a block diagram illustrating an electronic device 101 in a network environment 100 according to certain embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform certain data processing or computation. According to an embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. The memory 130 may store certain data used by at least one component (e.g., the processor 120 or the sensor module 176) of the electronic device 101. The certain data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert n electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These certain types of communication modules may be implemented as a single component (e.g., a single chip), or may be implemented as multi components (e.g., multi chips) separate from each other.

The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit/receive a signal or power to/from an external entity (e.g., an external electronic device). According to some embodiments, the antenna module 197 may be formed of a conductor or a conductive pattern and may further include any other component (e.g., RFIC). According to an embodiment, the antenna module 197 may include one or more antennas, which may be selected to be suitable for a communication scheme used in a specific communication network, such as the first network 198 or the second network 199 by, for example, the communication module 190. Through the selected at least one antenna, a signal or power may be transmitted or received between the communication module 190 and the external electronic device.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
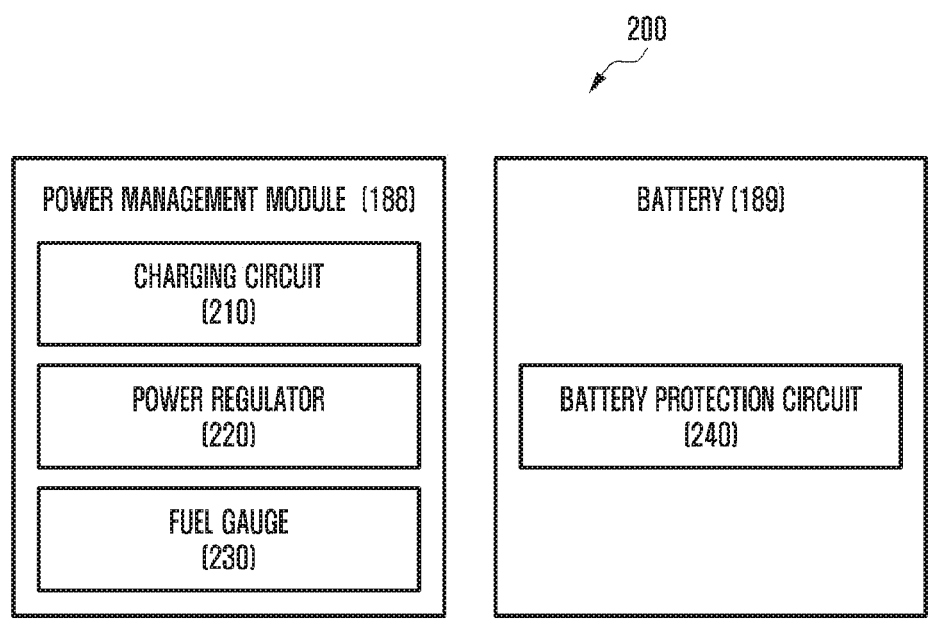
FIG. 2 is a block diagram showing a power management module and a battery of FIG. 1 according to various embodiments of the disclosure.

FIG. 2 is a block diagram 200 illustrating the power management module 188 and the battery 189 according to various embodiments.

Referring to FIG. 2, the power management module 188 may include charging circuitry 210, a power adjuster 220, or a power gauge 230. The charging circuitry 210 may charge the battery 189 by using power supplied from an external power source outside the electronic device 101.

According to an embodiment, the charging circuitry 210 may select a charging scheme (e.g., normal charging or quick charging) based at least in part on a type of the external power source (e.g., a power outlet, a USB, or wireless charging), magnitude of power suppliable from the external power source (e.g., about 20 Watt or more), or an attribute of the battery 189, and may charge the battery 189 using the selected charging scheme. The external power source may be connected with the electronic device 101, for example, directly via the connecting terminal 178 or wirelessly via the antenna module 197.

The power adjuster 220 may generate a plurality of powers having different voltage levels or different current levels by adjusting a voltage level or a current level of the power supplied from the external power source or the battery 189. The power adjuster 220 may adjust the voltage level or the current level of the power supplied from the external power source or the battery 189 into a different voltage level or current level appropriate for each of some of the components included in the electronic device 101. According to an embodiment, the power adjuster 220 may be implemented in the form of a low drop out (LDO) regulator or a switching regulator.

The power gauge 230 may measure use state information about the battery 189 (e.g., a capacity, a number of times of charging or discharging, a voltage, or a temperature of the battery 189).

The power management module 188 may determine, using, for example, the charging circuitry 210, the power adjuster 220, or the power gauge 230, charging state information (e.g., lifetime, over voltage, low voltage, over current, over charge, over discharge, overheat, short, or swelling) related to the charging of the battery 189 based at least in part on the measured use state information about the battery 189. The power management module 188 may determine whether the state of the battery 189 is normal or abnormal based at least in part on the determined charging state information. If the state of the battery 189 is determined to abnormal, the power management module 188 may adjust the charging of the battery 189 (e.g., reduce the charging current or voltage, or stop the charging). According to an embodiment, at least some of the functions of the power management module 188 may be performed by an external control device (e.g., the processor 120).

The battery 189, according to an embodiment, may include a protection circuit module (PCM) 240. The PCM 240 may perform one or more of various functions a pre-cutoff function) to prevent a performance deterioration of, or a damage to, the battery 189. The PCM 240, additionally or alternatively, may be configured as at least part of a battery management system (BMS) capable of performing various functions including cell balancing, measurement of battery capacity, count of a number of charging or discharging, measurement of temperature, or measurement of voltage.

According to an embodiment, at least part of the charging state information or use state information regarding the battery 189 may be measured using a corresponding sensor (e.g., a temperature sensor) of the sensor module 176, the power gauge 230, or the power management module 188. According to an embodiment, the corresponding sensor (e.g., a temperature sensor) of the sensor module 176 may be included as part of the PCM 240, or may be disposed near the battery 189 as a separate device.

Figure 3:
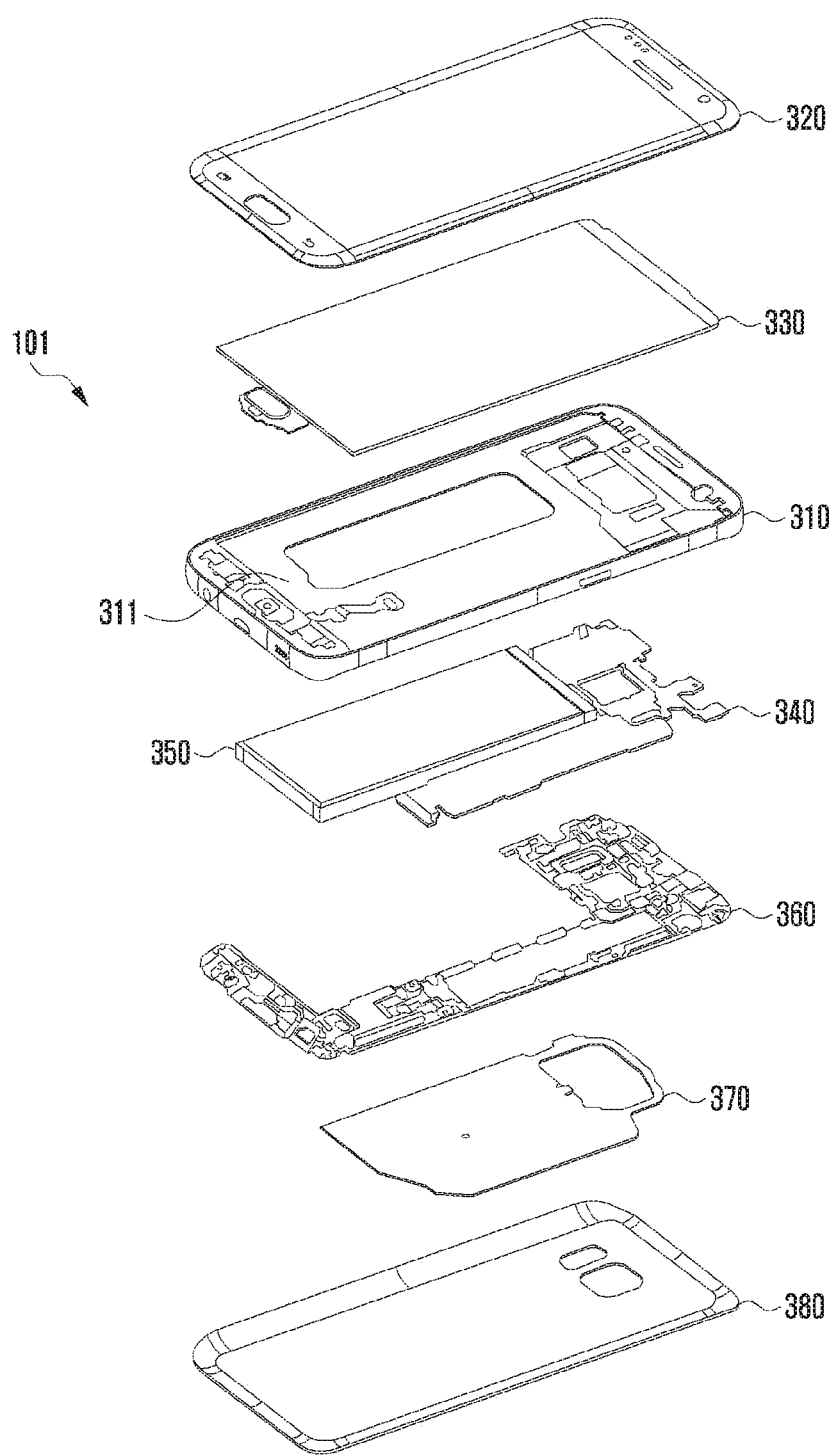
FIG. 3 is an exploded perspective view of the electronic device of FIG. 1 according to various embodiments of the disclosure.

FIG. 3 is a developed perspective view of the electronic device (101) of FIG. 1

Referring to FIG. 3, the electronic device 101 may include a side bezel structure 310 (for example, a housing), a first support member 311 (for example, a bracket), a front plate 320, a display 330, a printed circuit board 340, a battery 350, a second support member 360 (for example, a rear case), an antenna 370, and a rear plate 380.

In some embodiments, at least one of the constituent elements (for example, the first support member 311 or the second support member 360) of the electronic device 101 may be omitted, or the electronic device 101 may further include another constituent element. At least one of the constituent elements of the electronic device 101 pray be identical or similar to at least one of the constituent elements of the electronic device 101 of FIG. 1, and repeated descriptions thereof will be omitted herein.

The first support member 311 may be arranged inside the electronic device 101 and connected to the side bezel structure 310, or may be formed integrally with the side bezel structure 310. The first support member 311 may be made of a metal material and/or a nonmetal (for example, polymer) material, for example. The display 330 may be coupled to one surface of the first support member 311, and the printed circuit board 340 may be coupled to the other surface thereof.

A processor, a memory, and/or an interface may be mounted on the printed circuit board 340. The processor may include, for example, one or more of a central processing device, an application processor, a graphic processing device, an image signal processor, an sensor hub processor, or a communication processor. The memory may include a volatile memory or a non-volatile memory, for example. The interface may include, for example, a high definition multimedia interface (HDMI), a universal serial bus (USB) interface, an SD card interface, and/or an audio interface. The interface may connect the electronic device 101 with an external electronic device electrically or physically, for example, and may include a USB connector, an SD card/MMC connector, or an audio connector.

The battery 350 is an device for supplying power to at least one constituent element of the electronic device 101, and may include a non-rechargeable primary cell, a rechargeable secondary cell, or a fuel cell, for example. At least a part of the battery 350 may be arranged on substantially the same plane with the printed circuit board 340, for example. The battery 350 may be arranged integrally inside the electronic device 101, or may be arranged such that the same can be attached to/detached from the electronic device 101.

The antenna 370 may be arranged between the rear plate 380 and the battery 350. The antenna 370 may include, for example, a near field communication (NFC) antenna, a wireless charging antenna, and/or a magnetic secure transmission (MST) antenna. The antenna 370 may conduct near-field communication with an external device or may wirelessly transmit/receive power necessary for charging, for example. In another embodiment, an antenna structure may be formed by a part or a combination of the side bezel structure 310 and/or the first support member 311.

Hereinbefore, the disclosure has been described according to various embodiments of the disclosure. However, it is natural that modifications and changes made by a person skilled in the art to which the disclosure belongs without departing from the technical idea of the disclosure fall within the disclosure.

FIG. 4 is a schematic block diagram of an electronic device that can detect and control the status of a battery using a sensor according to various embodiments of the disclosure.

Figure 4:
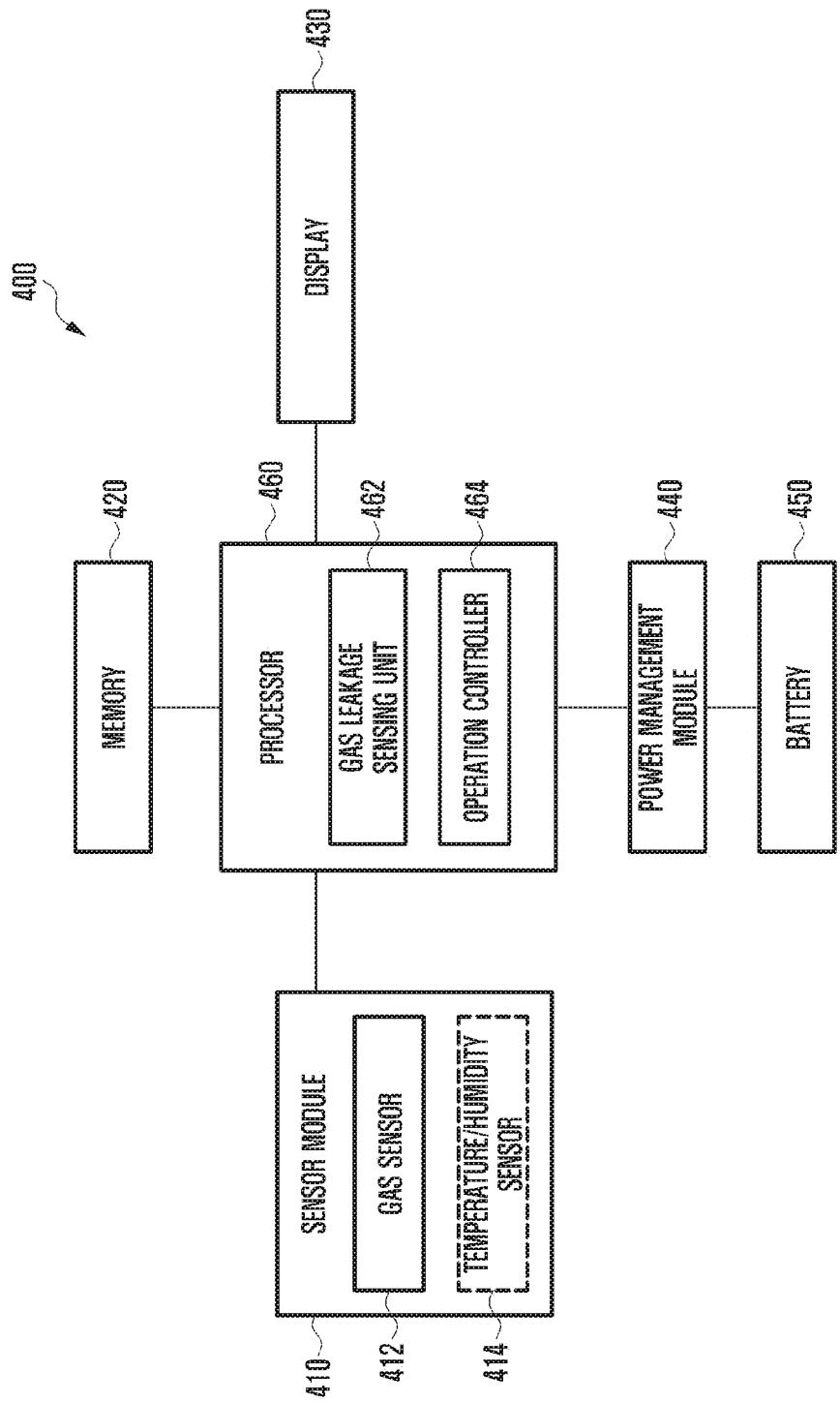
FIG. 4 is a schematic block diagram of an electronic device that can detect and control the status of a battery using a sensor according to various embodiments of the disclosure.

Referring to FIG. 4, an electronic device 400 according to various embodiments of the disclosure may include a sensor module 410, a memory 420, a display 430, a power management module 440, a battery 450, and a processor 460.

According to various embodiments, the electronic device 400 may include some of the electronic devices 101, 102, and 104 shown in FIG. 1 or the electronic device 101 shown in FIG. 3. The sensor module 410 may include the sensor module 176 shown in FIG. 1. The memory 420 may include the memory 130 shown in FIG. 1. The display 430 may include the display device 160 shown in FIG. 1 or the display 330 shown in FIG. 3. The power management module 440 may include the power management module 188 shown in FIGS. 1 and 2. The battery 450 may include the battery 189 shown in FIGS. 1 and 2 or the battery 350 shown in FIG. 3. The processor 460 may include the processor 120 shown in FIG. 1.

The sensor module 410 may include a gas sensor 412 and a temperature/humidity sensor 414. According to various embodiments, the sensor module 410 may further include at least one of an airflow sensor and a pressure sensor.

The gas sensor 412 can sense gas produced and leaking from the battery 450. The gas sensor 412 can recognize the concentration and the kind of the gas leaking from the battery 450. The gas sensor 412 may use at least one of a semiconductor type, an electrochemical type, a contact ignition type, an optical type, etc. At least one or more gas sensors 412 may be provided in the sensor module 410. When there are two gas sensors 412 in the sensor module 410, depending on the gas detection speed, one gas sensor can detect gas flowing inside from the outside of the electronic device 400 and the other gas sensor can detect gas leaking from an internal component (e.g., the battery 450) of the electronic device 400. The electronic device 400 can process information about external gas and internal gas, based on sensing signals obtained through the two sensors.

The temperature/humidity sensor 414 can detect temperature and humidity outside and inside the electronic device 400. The temperature/humidity sensor 414 can improve the accuracy of a gas signal value sensed through the gas sensor 412. According to an embodiment, the electronic device may further include a pressure sensor, an airflow sensor, etc., other than the temperature/humidity sensor 414. According to an embodiment, when the gas sensor 412 is a semiconductor type, the gas sensor 412 sensitively reacts to temperature and humidity inside and outside the electronic device 400 with power applied, whereby a resistance value and gas sensitivity may be changed. For example, when the temperature outside and inside the electronic device 400 is high, resistance decreases due to the semiconductor characteristic of the gas sensor 412 and the gas leaking from the inside of the electronic device 400, and when humidity is high, the moisture around the electronic device 400 acts as reduction gas, so the resistance value of the gas sensor 412 may decrease. The electronic device 400 can check changes of reference values related to the temperature and humidity around the electronic device 400 through the temperature/humidity sensor 414 and can correct the reference values according to the temperature and humidity. The temperature/humidity sensor 414 may be disposed adjacent to the gas sensor 412. The electronic device 300 can process information about the gas sensed by the gas sensor 412, based on a sensing signal obtained through the temperature/humidity sensor 414.

The memory 420 can store information about operation control for the electronic device 400 that corresponds to the kind, concentration, spread speed, etc. of gas leaking from the battery 450 and sensed by the gas sensor 412. The memory 420 can store the information about operation control in a lookup table type.

According to an embodiment, when the gas sensor 412 senses that the concentration of the gas (e.g., $CO_2$) leaking from the battery 450 exceeds a first threshold within a predetermined time, the memory 420 can transmit an instruction to notify the user interface of the fact through the display 430 to the processor 460. According to an embodiment, when the gas sensor 412 senses that the concentration of the gas leaking from the battery 450 exceeds a second threshold within a predetermined time, the memory 420 can transmit an instruction that makes it possible to block signals that are transmitted through a circuit mounted on a printed circuit board (e.g., the printed circuit board 340) in the electronic device 400. According to an embodiment, when the gas sensor 412 senses that the concentration of the gas leaking from the battery 450 exceeds a third threshold within a predetermined time, the memory 420 can transmit the serial number of the electronic device 400 and sensed gas-related information, for example, to a server (e.g., the server 108 shown in FIG. 1) of a service center and can transmit an instruction that makes it possible to turn off the power to the processor 460 through a network (e.g., the second network 199 shown in FIG. 1). According to an embodiment, when the gas sensor 412 senses that the concentration of the gas (e.g., a volatile organic compound (TVOC)) detected from the electronic device 400 exceeds a predetermined threshold, the memory 420 can transmit an instruction that makes it possible to control an Internet-of-Thing (IoT) device (e.g., a window and an air purifier) to the processor 460 through a network (e.g., the first network 198 shown in FIG. 1).

According to various embodiments, the memory 420 performs a function that stores programs, an operating system (OS), and input/output data for processing and controlling of the processor 460 and can store programs for controlling the general operation of the electronic device 400. The memory 420 can store various items of configuration information that are required to process functions related to various embodiment of the disclosure in the electronic device 400.

When the gas sensor 412 senses that the concentration of the gas (e.g., $CO_2$) leaking from the battery 450 exceeds a predetermined threshold, the display 430 can display a user interface (e.g., a warning message) saying the fact to the user of the electronic device 400.

According to various embodiments, the display 430 can perform an input function and a display function. To this end, the display 430 may include a touch panel. The display 430 may be a Liquid Crystal Display (LCD), an Organic Light Emitting Diode (OLED), an Active Matrix Organic Light Emitting Diode (AMOLED), a flexible display, a transparent display, etc. The display 430 can visually provide the menu, input data, function configuration information, and other various items of information of the electronic device 400 to a user.

The power management module 440 can manage power of the electronic device 400. The power management module 440 can receive a control signal from the processor 460 and perform a charging control operation for the battery 450. According to an embodiment, the power management module 440 may include a Power Management Integrated Circuit (PMIC), a charger Integrated Circuit (IC), or a battery or a fuel gauge. For example, when the electronic device 400 is turned on, the power management module 440 (e.g., a PMIC) can supply the power of the battery 405 to other components (e.g., the processor 460). The power management module 440 can receive a command from the processor 460 and can manage power supply in response to the received command. According to an embodiment, the fuel gauge can measure the use status information of the battery 450 (e.g., the remaining power, an in-charging voltage, a current, or temperature of the battery 450).

The battery 450 can supply power to at least one component of the electronic device 400. For example, the battery 450 may include a non-rechargeable primary battery, a rechargeable secondary battery, or a fuel cell.

The processor 460 can control the functions and operations of the sensor module 410, the memory 420, the display 430, the power management module 440, and the battery 450 in the electronic device 400. The processor 460 can obtain a signal sensing the gas leaking from the battery 450 using the gas sensor 412. The processor 460 may be configured to set at least one characteristic associated with charging of the battery 450 when determining that the obtained gas sensing signal exceeds a predetermined threshold. The processor 460 can provide a user interface (UI) giving notice that gas has leaked from the battery 450 to the user of the electronic device 400. The processor 460 can be operated to perform instructions that are transmitted through the memory 420.

According to an embodiment, the processor 460 may include a gas leakage sensing unit 462 and an operation controller 464.

The gas leakage sensing unit 462 can sense gas leakage from the battery 450, based on a sensing signal obtained by the gas sensor 412. For example, the gas leakage sensing unit 462 can determine that the larger the intensity of a sensing signal obtained by the gas sensor 412, the larger the amount of the gas leaking from the battery 450. The gas leakage sensing unit 462 can sense temperature and humidity outside and inside the electronic device 400 through the temperature/humidity sensor 414 so that the accuracy of the gas signal value that is sensed by the gas sensor 412 can be improved. The gas leakage sensing unit 462 can sense gas leakage from the battery 450, based on not only the gas sensing signal obtained by the gas sensor 412, but also at least one of the temperature inside and outside of the electronic device 400 and gas sensing time information obtained by the gas sensor 412. According to an embodiment, the gas leakage sensing unit 462 can determine whether gas leaks from the battery 450 by obtaining battery-related information (e.g., the numbers of times of charging and discharging) through a battery protection circuit (e.g., the battery protection circuit 240 shown in FIG. 2) in the battery 450.

The operation controller 464 can control the operation of the power management module 440 in the electronic device 400, based on gas leakage-related information of the battery 450 obtained by the gas leakage sensing unit 462 (e.g., the degree of gas leakage, the point in time when gas starts leaking, the duration time of gas leakage, and the level of danger according to the degree of gas leakage). The operation controller 464 can provide information associated with gas leakage to the user of the electronic device 400 through the display 430. The operation controller 464 can control charging of the battery 450 in accordance with the type of the gas that leaks from the battery 450. For example, the operation controller 464 can adjust the charging current or the charging voltage of the battery 450 that is being charged. The operation controller 464 can stop charging of the battery 450 that is being charged, or can limit charging of the battery 450 from the beginning.

According to various embodiments, the processor 460 can perform the function that controls the general operation of the electronic device 400 and the flow of signals between internal components and processes data. The processor 460, for example, may be a Central Processing Unit (CPU), an application processor, a communication processor, etc. The processor 460 may be a single core processor or a multi-core processor and may be composed of several processors.

Figure 5:
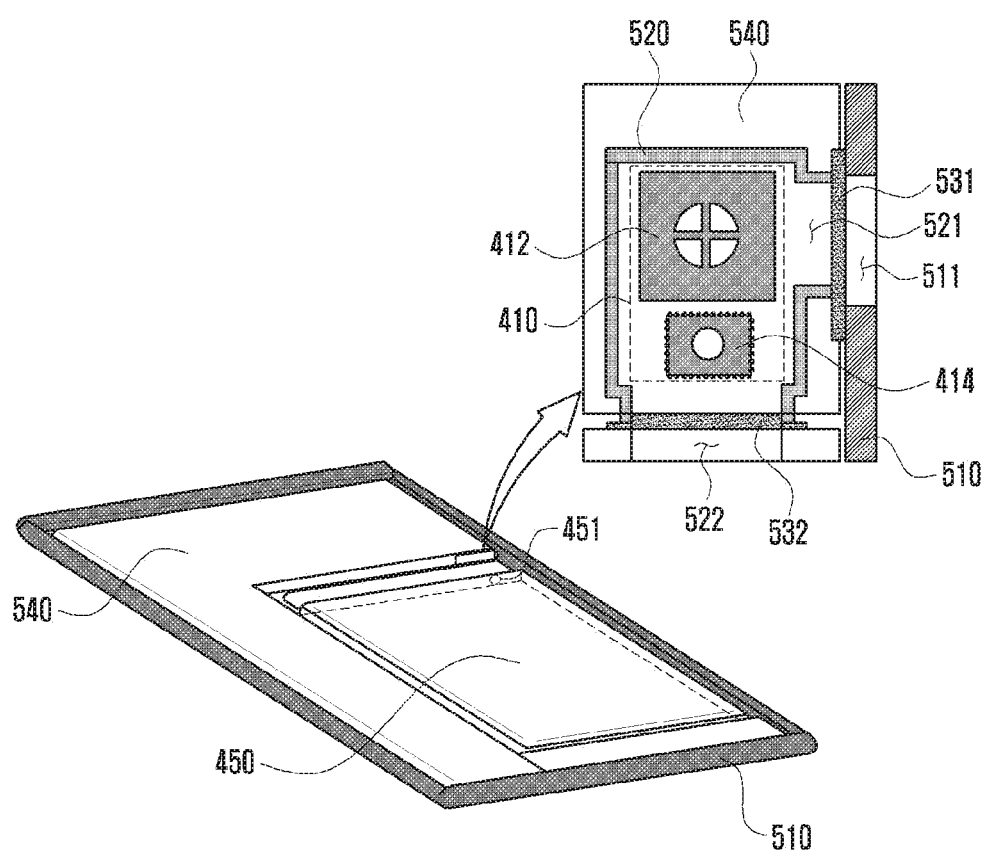
FIG. 5 is a diagram showing the configuration of an example of an electronic device that can detect the status of a battery using a sensor according to various embodiments of the disclosure.

FIG. 5 is a diagram showing the configuration of an example of an electronic device that can detect the status of a battery using a sensor according to various embodiments of the disclosure.

Referring to FIG. 5, the electronic device 400 according to various embodiments of the disclosure may include a housing 510, an accommodator 520, a battery 450, a first sealing member 531, a second sealing member 532, and a printed circuit board 540.

According to various embodiments, the housing 510 may include the housing 310 shown in FIG. 3. The printed circuit board 540 may include the printed circuit board 340 shown in FIG. 3.

The housing 510, for example, may have a side bezel structure. The housing 510 may have at least one hole 511 (e.g., a microphone hole, a speaker hole, and a connector hole (e.g., for a USB and an earphone jack)). According to an embodiment, the at least one hole 511 may be an independent hole for obtaining a gas sensing signal through the gas sensor 412 shown in FIG. 4.

The accommodator 520 may be disposed in the housing 510. The accommodator 520 may include the sensor module 410. According to an embodiment, the accommodator 520 may be a box-shaped housing. The sensor module 410 may include at least one gas sensor 412 and temperature/humidity sensor 414. According to an embodiment, the temperature/humidity sensor 414 may be further provided to be able to improve the accuracy of a gas signal value sensed through the gas sensor 412.

The accommodator 520 may be disposed on the printed circuit board 540. The accommodator 520 can isolate the sensor module 410 from gas that is produced by various elements on the printed circuit board 540. The accommodator 520 may be designed to minimize dead spaces in the electronic device 400. According to an embodiment, the accommodator 520 may be combined with the printed circuit board 540 while surrounding the gas sensor 412. The accommodator 520 can prevent gas in the electronic device 400 from flowing into the sensor module 410. The accommodator 520 can protect the gas sensor 412 and the temperature/humidity sensor 414 from shock (e.g., physical shock and environmental factors such as dust and moisture) that is transmitted from the outside of the electronic device 400. The material of the accommodator 520 may include metals with low out gas (e.g., stainless steel). When injection molding of the accommodator 520 is required, the accommodator 520 may be made of polycarbonate, polymethylmethacrylate, etc. According to an embodiment, the accommodator 520 may have a first hole 521 formed in a first direction and a second hole 522 formed in a second direction. For example, the first hole 521 may be disposed at a position corresponding to the hole 511 of the housing 510.

The second hole 522 may be disposed at a position corresponding to the hole 451 formed at a predetermined position in the battery 450. The second hole 522 may be used as an intake port for receiving the gas leaking from the hole 451 of the battery 450. The first hole 521 may be used as a discharge port for discharging the gas, which leaks from the hole 451 of the battery 450, to the outside of the housing 510. The first hole 521 and the second hole 522 formed at the accommodator 520 may be disposed to face each other or in adjacent different directions, depending on the first direction and the second direction. According to an embodiment, the first hole 521 may be replaced by the at least one hole 511 formed at the housing 510 without being physically formed. The second hole 522 may be replaced by the battery hole 451 without being physically formed.

The battery 450 may be disposed in the housing 510. The battery 450 may be disposed in substantially the same plane as the printed circuit board 540. The battery 450 may be integrally disposed in the electronic device 400 and may be detachably attached to the electronic device 400.

The first sealing member 531 may be disposed around (on the outer surface of) the first hole 521 of the accommodator 520. Alternatively, the first sealing member 531 may be disposed in the connection area between the first hole 521 of the accommodator 520 and the hole 511 of the housing 510. The first sealing member 531 may be made of rubber, silicon, etc. The first sealing member 531 can perform a waterproof and dustproof function to prevent water and fine dust from entering inside through the hole 511 of the housing 510. The first sealing member 531 may be formed in a mesh structure. The first sealing member 531 may include a membrane.

The second sealing member 532 may be disposed around (on the inner surface of) the second hole 522 of the accommodator 520. Alternatively, the second sealing member 532 may be disposed in the connection area between the second hole 522 of the accommodator 520 and the hole 451 of the housing 450. The second sealing member 532 may be made of rubber, silicon, etc. The second sealing member 532 can perform a waterproof and dustproof function to prevent water and fine dust from entering into the hole 451 of the battery 450. The second sealing member 532 may be formed in a mesh structure. The second sealing member 532 may include a membrane. According to an embodiment, the second sealing member 532 may be selectively used to prevent water and fine dust from entering into the hole 451 of the battery 450. According to an embodiment, the first sealing member 531 and the second sealing member 532 may not be provided to easily discharge gas leaking from the battery 450 to the outside of the housing 510 through the second hole 522 and the first hole 521 of the accommodator 520. According to an embodiment, the second hole 522 of the accommodator 520 may be larger than the first hole 521 so that the gas leaking from the battery 450 can flow faster inside. The second hole 522 of the accommodator 520 may be the same in size as the first hole 521. According to an embodiment, the sizes or the lengths of the first hole 521 and the second hole 522 of the accommodator 520 may be determined in accordance with the structure and characteristics of the electronic device 400.

Figure 6:
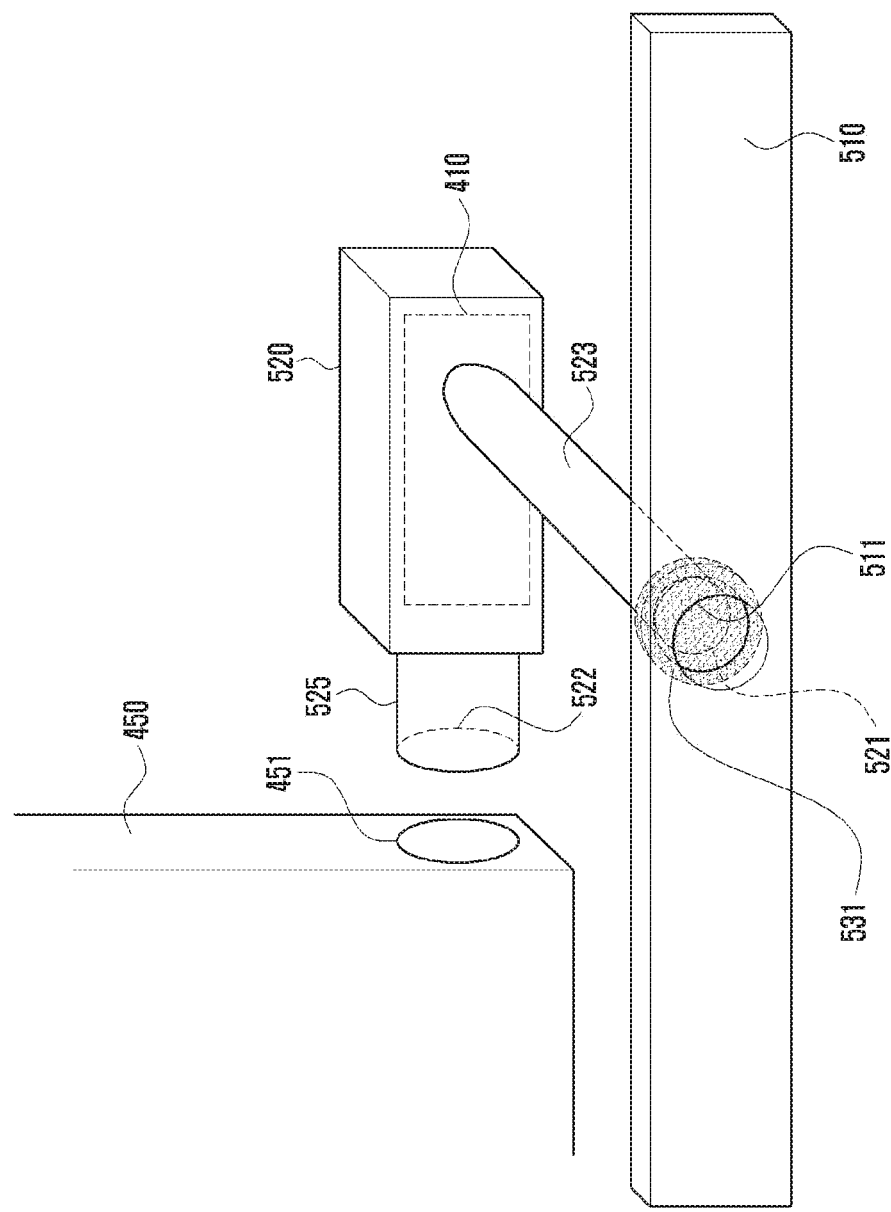
FIG. 6 is a view showing the configuration between an accommodator, a first hole, and a second hold of an electronic device according to various embodiments of the disclosure.

FIG. 6 is a view showing the configuration between an accommodator, a first hole, and a second hold of an electronic device according to various embodiments of the disclosure.

Referring to FIG. 6, unlike the configuration shown in FIG. 5, a first pipeline 523 may be disposed between the accommodator 520 and the first hole 521 and a second pipeline 525 may be disposed between the accommodator 520 and the second hole 522 in the electronic device 400 according to various embodiments of the disclosure.

According to an embodiment, the first pipeline 523 and the second pipeline 525 may not be physical pipelines and may be paths that gas can pass through.

The first pipeline 523 can form a passage by connecting the outside of the housing 510 and the accommodator 520 including the sensor module 410. According to an embodiment, when external air outside the housing 510 flows inside through the first hole 521 connected with the first pipeline 523, the sensor module 410 can sense and detect temperature and humidity at the place, where the user of the electronic device 400 is positioned, through the temperature/humidity sensor 414. According to an embodiment, the first pipeline 523 may be replaced by a path, which is formed by contact between the at least one hole 511 formed at the housing 510 and the first direction of the accommodator 520, without being physically formed. The second pipeline 525 may be replaced by a path formed by contact between the second direction of the accommodator 520 and the battery hole 451 without being physically formed.

The second pipeline 525 can form a passage by connecting the hole 451 of the battery 450 and the accommodator 520 including the sensor module 410. According to an embodiment, when gas flows inside from the hole 451 of the battery 450 through the second hole 522 connected with the second pipeline 525, the sensor module 410 can detect the flowing-in gas through the gas sensor 412. For example, when the flowing-in gas exceeds a predetermined threshold, the processor of the electronic device 400 senses that a problem has be generated with the battery 450, and can stop some functions of the electronic device 400. According to an embodiment, when gas is produced in the battery 450, the hole 451 formed at a predetermined position in the battery 450 enables the generated gas to be discharged out of the battery 450, thereby being able to expansion and damage of the battery 450.

According to an embodiment, the first pipeline 523 and the second pipeline 525 may mean pipes that physically exist to be able to induce flow of gas and air. The first pipeline 523 and the second pipeline 525 may mean paths formed to pass gas and air without physically existing.

According to an embodiment, the first pipeline 523 and the second pipeline 525 may mean pipes that physically exist to be able to induce flow of gas and air. The first pipeline and the second pipeline 525 may mean paths inducing flow of gas and air without physically existing. According to an embodiment, the second pipeline 525 may be shorter than the first pipeline 523 so that the gas leaking from the battery 450 can flow faster inside. According to an embodiment, the first pipeline 525 connected with the first hole 521 may be independently formed. Alternatively, the first pipeline 525 connected with the first hole 521 may use the at least one hole 511 formed at the housing 510 of the electronic device 400 (e.g., a microphone hole, a speaker hole, and a connector hole (e.g., for a USB and an earphone jack).

Figure 7:
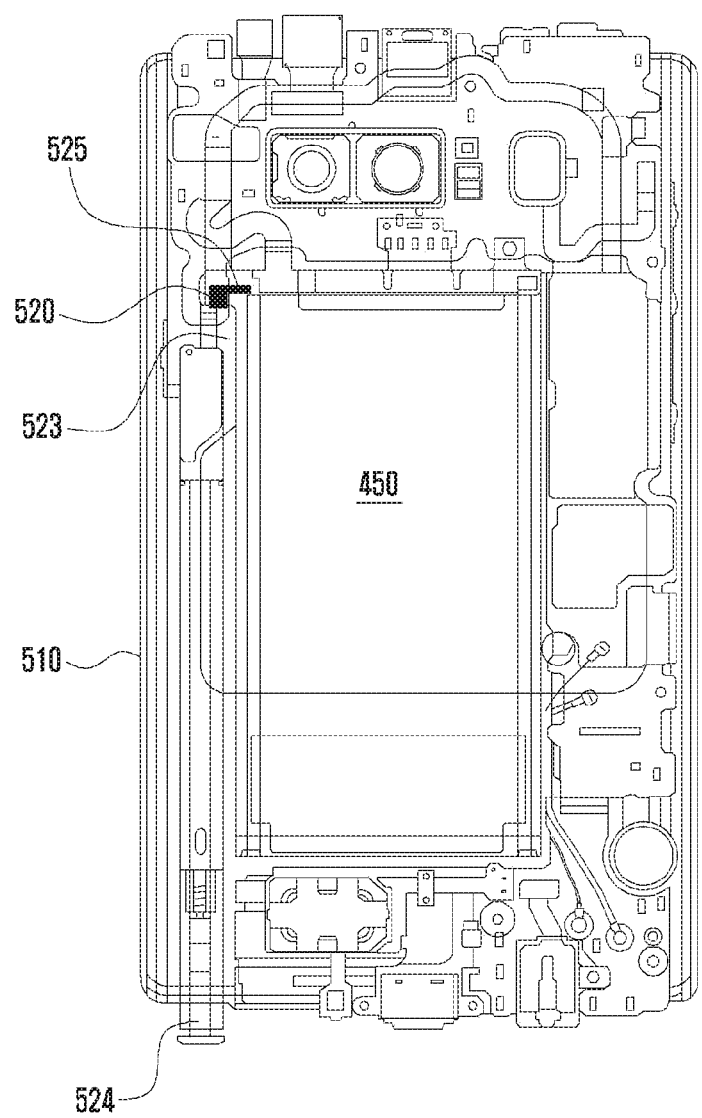
FIG. 7 is a diagram showing an example of a mounting structure of the accommodator of an electronic device according to various embodiments of the disclosure.

FIG. 7 is a diagram showing an example of a mounting structure of the accommodator of an electronic device according to various embodiments of the disclosure.

Referring to FIG. 7, the accommodator 520 of the electronic device 400 according to various embodiments of the disclosure can detect air and gas flowing inside from the outside of the housing 510 using the insertion path of a smart pen 524, which is detachably attached to the electronic device 400, as the first pipeline 523. In this case, the second pipeline 525 of the accommodator 520 may be formed through a portion of separation wall on which the battery 450 is mounted.

Figure 8:
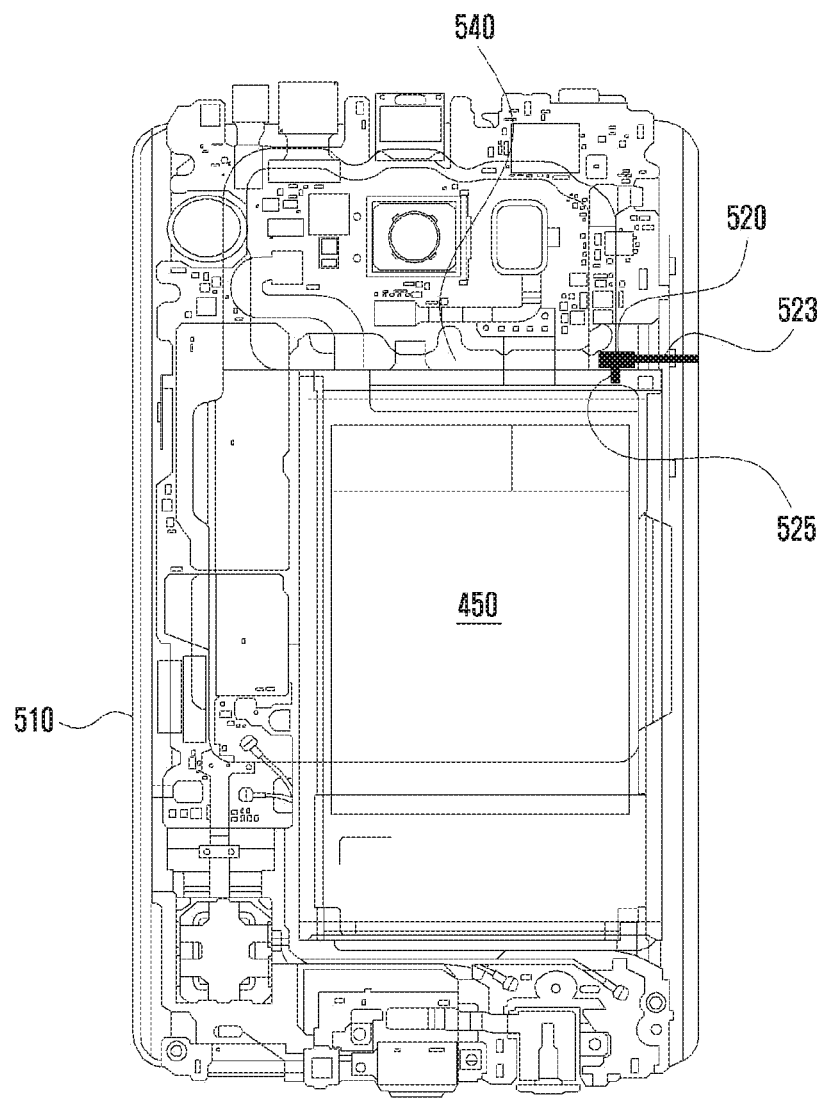
FIG. 8 is a diagram showing another example of a mounting structure of the accommodator of an electronic device according to various embodiments of the disclosure.

FIG. 8 is a diagram showing another example of a mounting structure of the accommodator of an electronic device according to various embodiments of the disclosure.

Referring to FIG. 8, the accommodator 520 of the electronic device 400 according to various embodiments of the disclosure may be disposed on the printed circuit board 540 at the right upper portion from the battery 450 so that the first pipeline 523 and the second pipeline 525 can be shortest. The accommodator 520 may be disposed on the printed circuit board 540 at the left lower portion from the battery 450 so that the first pipeline 523 and the second pipeline 525 can be shortest. According to an embodiment, the positions of the accommodator 520, the first pipeline 523, and the second pipeline 525 may be changed in various ways in accordance with the position of the hole 451 formed at the battery 450 (e.g., the battery hole 451 shown in FIGS. 5 and 6). According to an embodiment, even if the electronic device 400 is a wearable device, a mounting structure similar to the accommodator 520 shown in FIG. 8 can be applied.

Figure 9:
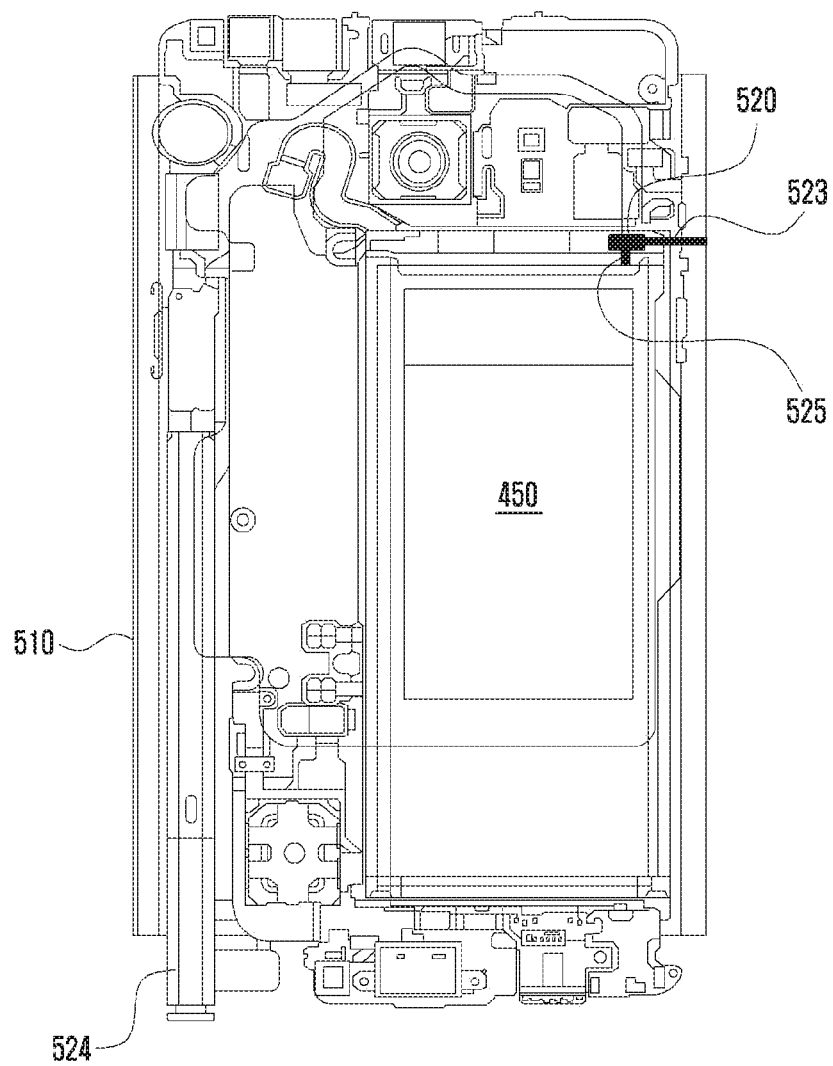
FIG. 9 is a diagram showing another example of a mounting structure of the accommodator of an electronic device according to various embodiments of the disclosure.

FIG. 9 is a diagram showing another example of a mounting structure of the accommodator of an electronic device according to various embodiments of the disclosure.

Referring to FIG. 9, in the accommodator 520 of the electronic device 400 according to various embodiments of the disclosure, the first pipeline 523 may be formed by independently forming a hole through a portion of the housing 510 disposed around the upper portion of the battery 450. According to an embodiment, it is possible to use the insertion path of the smart pen 524 detachably attached to the electronic device 400 as the first pipeline 523 of the accommodator 520. However, in this case, the length of the first pipeline 523 increases, so it may not be easy to detect air flowing inside from the outside of the housing 520 using the sensor module 410. Accordingly, as described above with reference to FIG. 9, the first pipeline 523 of the accommodator 520 is independently formed, thereby being able to easily detect external air using a sensor module (e.g., 410 in FIG. 4).

Figure 10:
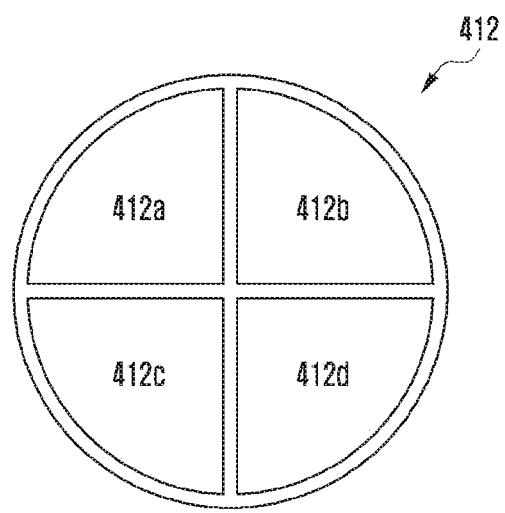
FIGS. 10 and 11 are diagrams showing various configurations of a gas sensor of an electronic device according to various embodiments of the disclosure.
Figure 11:
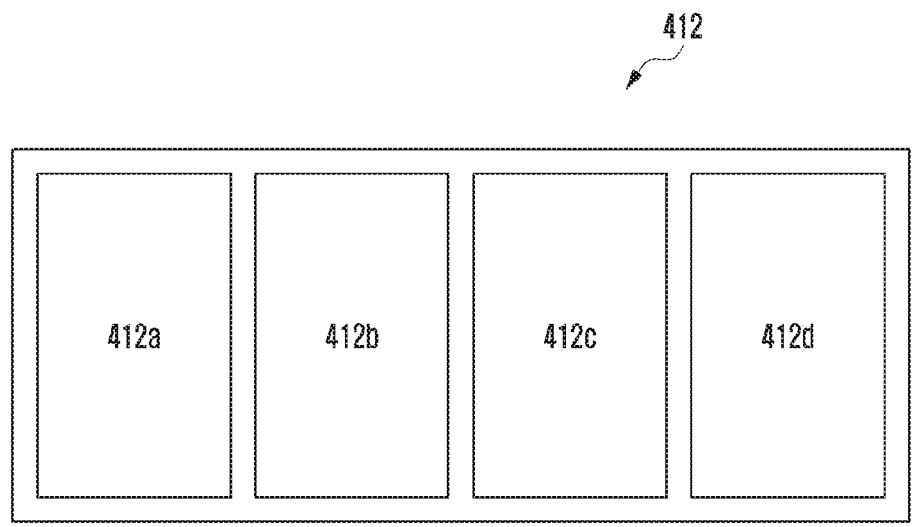

FIGS. 10 and 11 are diagrams showing various configurations of a gas sensor of an electronic device according to various embodiments of the disclosure.

The gas sensor 412 of the electronic device 400 according to various embodiments may have an array shape composed of at least one or more cells to be able to selectively sense and detect the kind and concentration of gas leaking from the battery 450.

According to an embodiment, the gas sensor 412 shown in FIG. 10 may include a first cell 412a to a fourth cell 412d and may have a circular array shape. According to an embodiment, the gas sensor 412 shown in FIG. 11 may include a first cell 412a to a fourth cell 412d and may have an oblong array shape.

The first cell 412a to the fourth cell 412d of the gas sensor 412 can selectively sense and detect the kind and concentration of the gas leaking from the battery 450. According to an embodiment, the first cell 412a may be made of $SnO_2$, the second cell 412b may be made of $WO_2$, the third cell 412c may be made of $TiO_2$, and the fourth cell 412d may be made of $Z_nO$. The first cell 412a to the fourth cell 412d may use various metal and ceramic materials as a catalyst.

According to an embodiment, the first cell 412a to the fourth cell 412d of the gas sensor 412 may be configured to detect specific gases, respectively. The first cell 412a to the fourth cell 412d each may include a heater to be able to detect a corresponding specific gas and may be maintained at different temperatures, respectively. The data about the kinds and concentration of the specific gases that can be detected by the first cell 412a to the fourth cell 412d can be stored in a lookup table type in the memory 420. According to an embodiment, the first cell 412a to the fourth cell 412d can sense and detect the gas leaking from the battery 450 by sequentially controlling their temperatures using their heaters.

According to various embodiments, the first cell 412a can detect carbon dioxide ($CO_2$). The carbon dioxide ($CO_2$) may be gas flowing inside from the outside of the electronic device 400 or gas leaking out of the electronic device 400 (e.g., the battery 450). In this case, the first cell 412a can recognize whether the carbon dioxide ($CO_2$) has been produced and detected in the electronic device or whether the carbon dioxide ($CO_2$) has been detected outside the electronic device 400, based on the concentration of the gases detected by the second cell 412b to the fourth cell 412d.

According to various embodiments, the second cell 412b can detect carbon monoxide (CO). The carbon monoxide (CO) may be gas flowing inside from the outside of the electronic device 400 or gas leaking out of the electronic device 400 (e.g., the battery 450). In this case, the second cell 412b can recognize whether the carbon monoxide (CO) has been produced and detected in the electronic device or whether the carbon monoxide (CO) has been detected outside the electronic device 400, based on the concentration of the gases detected by the first cell 412b, the third cell 412c, and the fourth cell 412d.

According to various embodiments, the third cell 412c can detect hydrogen ($H_2$). The hydrogen ($H_2$) may be gas flowing inside from the outside of the electronic device 400 or gas leaking out of the electronic device 400 (e.g., the battery 450). In this case, the third cell 412c can recognize whether the hydrogen ($H_2$) has been produced and detected in the electronic device or whether the hydrogen ($H_2$) has been detected outside the electronic device 400, based on the concentration of the gases detected by the first cell 412a, the second cell 412b, and the fourth cell 412d.

According to various embodiments, the fourth cell 412d can detect a volatile organic compound (VOC). The volatile organic compound (VOC) may be gas flowing inside from the outside of the electronic device 400 or gas leaking out of the electronic device 400 (e.g., the battery 450). In this case, the fourth cell 412d can recognize whether the volatile organic compound (VOC) has been produced and detected in the electronic device or whether the volatile organic compound (VOC) has been detected outside the electronic device 400, based on the concentration of the gases detected by the first cell 412a to the third cell 412c.

Figure 12:
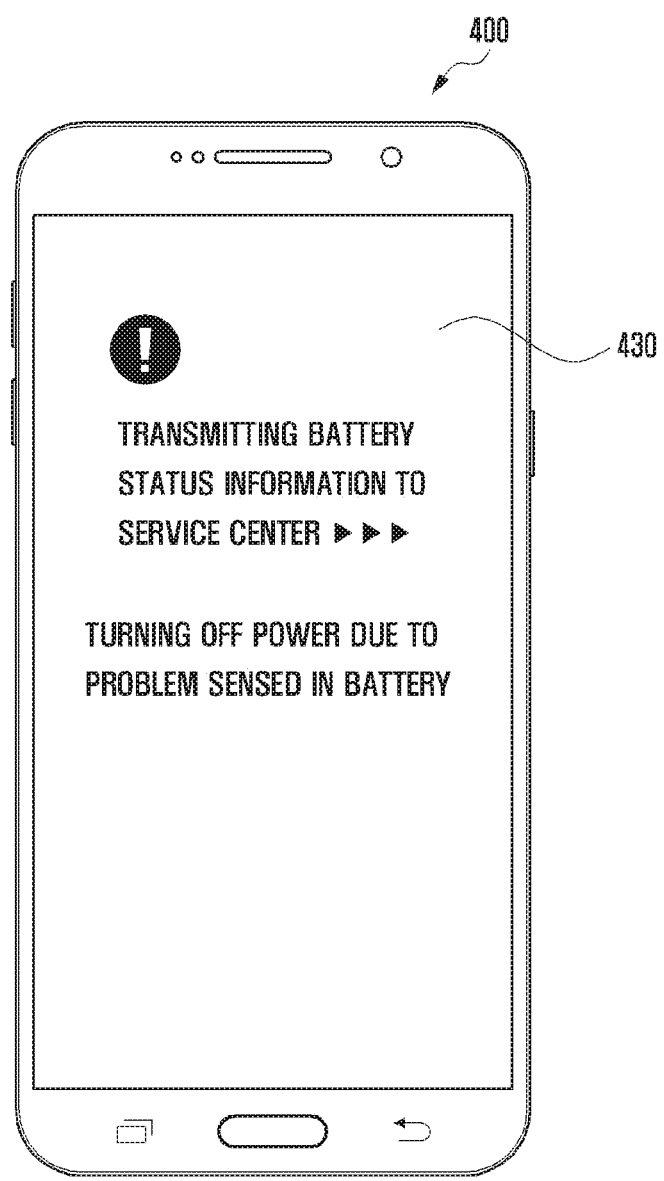
FIG. 12 is a diagram showing an example of a user interface (UI) shown through a display of an electronic device according to various embodiments of the disclosure.

FIG. 12 is a diagram showing an example of a user interface (UI) shown through a display of an electronic device according to various embodiments of the disclosure.

Referring to FIG. 12, the display 430 of the electronic device 400 according to various embodiments of the disclosure can be controlled by the processor 460 to display a user interface (UI) associated with gas leakage to the user of the electronic device 400, for example, when the gas sensor 412 senses that the concentration of the gas leaking from the battery 450 exceeds a predetermined threshold. For example, the user interface (UI) may include a warning message such as "turning off the power due to a problem sensed in the battery". According to an embodiment, when it is sensed that the concentration of the gas leaking from the battery 450 exceeds a predetermined threshold, the processor 460 transmits the serial number of the electronic device 400 and sensed gas-related information, for example, to a server (e.g., the server 108 shown in FIG. 1) of a service center and turns off the power of the electronic device 400 through a network (e.g., the second network 199 shown in FIG. 1), thereby being able to prevent a safety accident.

Figure 13:
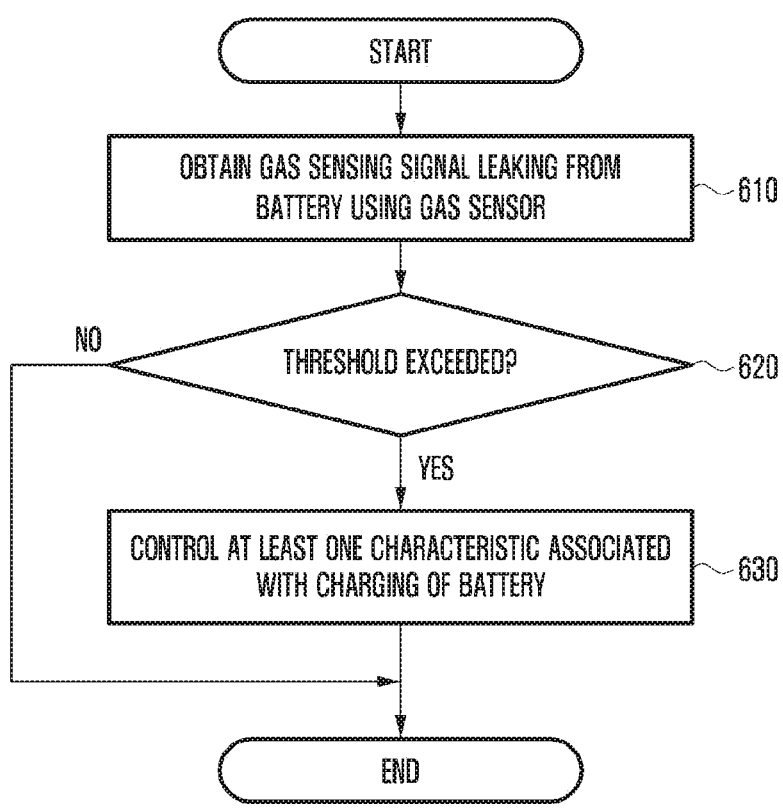
FIG. 13 is a flowchart showing a method for sensing and controlling the status of a battery using a sensor according to various embodiments of the disclosure.

FIG. 13 is a flowchart showing a method of sensing and controlling the status of a battery using a sensor according to various embodiments of the disclosure.

In the operation 610, the processor 460 of the electronic device 400 can obtain a signal sensing the gas leaking from the battery 450 using the gas sensor 412.

In the operation 620, the processor 460 can determine whether a gas sensing signal obtained through the operation 610 exceeds a predetermined threshold.

In the operation 630, the processor 460 can control at least one characteristic associated with charging of the battery 450 when it is determined in the operation 620 that the obtained gas sensing signal exceeds the predetermined threshold. Further, the processor 460 can display a user interface (UI) giving notice that gas has leaked from the battery 450.

Figure 14:
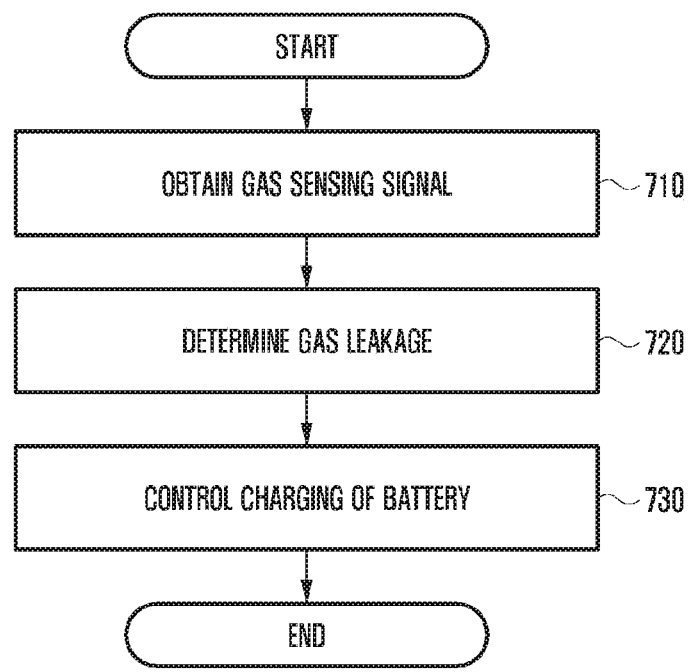
FIG. 14 is a flowchart showing a method for controlling charging of a battery in accordance with gas leakage determination of the battery according to various embodiments of the disclosure.

FIG. 14 is a flowchart showing a method for controlling charging of a battery in accordance with gas leakage determination of the battery according to various embodiments of the disclosure.

In the operation 710, the processor 460 of the electronic device 400 can obtain a signal sensing the gas leaking from the battery 450 using the gas sensor 412.

In the operation 720, the processor 460 can determine that a gas leaks from the battery 450, based on the gas sensing signal obtained through the operation 710.

In the operation 730, the processor 460 can control charging of the battery 450, based on the determination of gas leakage.

Figure 15:
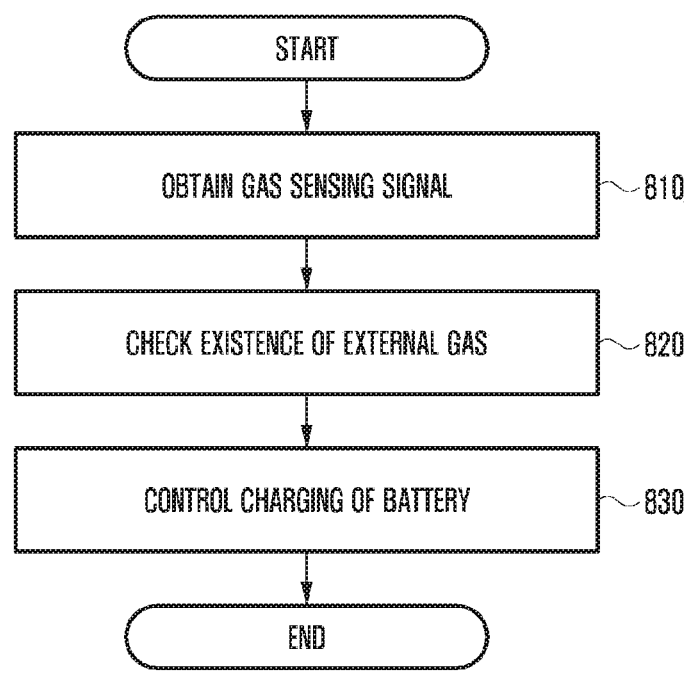
FIG. 15 is a flowchart showing a method for controlling charging of a battery in accordance with existence of external gas according to various embodiments of the disclosure.

FIG. 15 is a flowchart showing a method for controlling charging of a battery in accordance with existence of external gas according to various embodiments of the disclosure.

In the operation 810, the processor 460 of the electronic device 400 can obtain a signal sensing the gas leaking from the battery 450 using the gas sensor 412.

In the operation 820, the processor 460 can check whether gas exists outside the electronic device 400 using the gas sensor 412.

In the operation 830, the processor 460 can control charging of the battery 450, depending on whether gas exists outside the electronic device 400. According to an embodiment, the processor 460 can suppress charging of the battery 450 when determining that gas exists outside the electronic device 400. Further, the processor 460 can adjust a reference value associated with charging of the battery 450 when determining that gas exists outside the electronic device 400, using the gas sensor 412.

Figure 16:
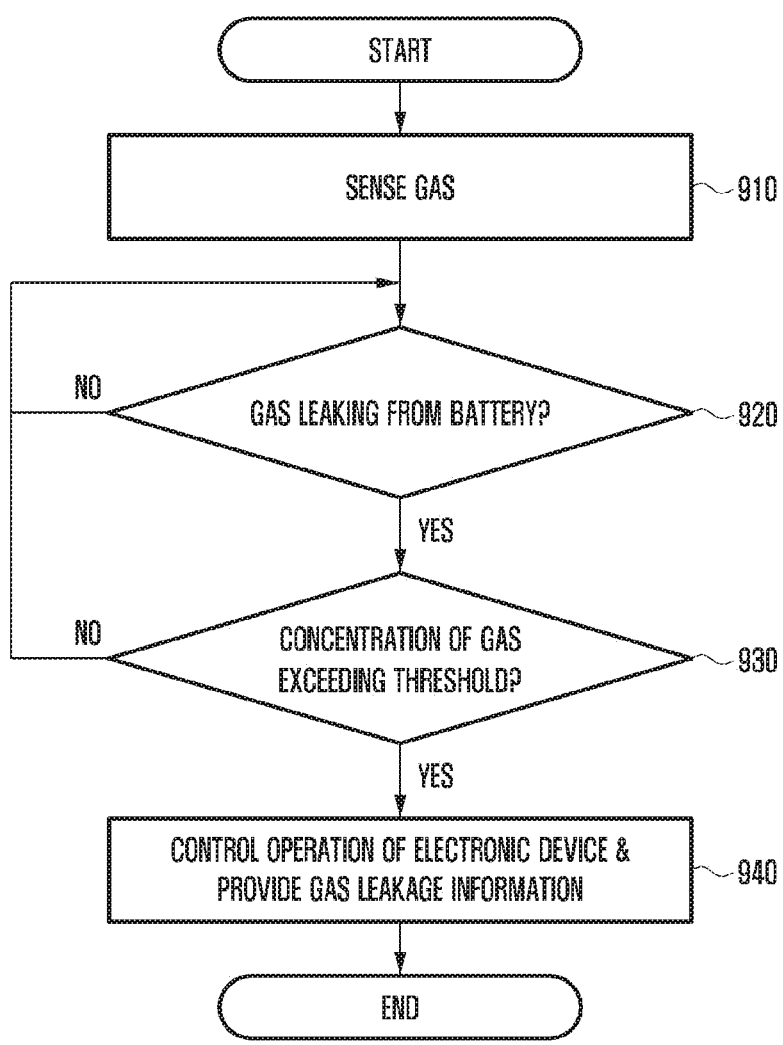
FIG. 16 is a flowchart showing a method for detecting gas leakage from a battery of an electronic device according to various embodiments of the disclosure and controlling the operation of the electronic device in response to a sensing signal.

FIG. 16 is a flowchart showing a method for detecting gas leakage from a battery of an electronic device according to various embodiments of the disclosure and controlling the operation of the electronic device in response to a sensing signal.

In the operation 910, the processor 460 of the electronic device 400 can sense gas existing inside and outside the electronic device 400, using the gas sensor 412.

In the operation 920, the processor 460 can determine whether the gas sensed from the electronic device 400 is gas leaking from the battery 450.

In the operation 930, the processor 460 can determine whether the concentration of the gas exceeds a predetermined threshold when determining the gas is gas leaking from the battery 450 in the operation 920.

According to an embodiment, the processor 460 can recognize the type of gas leakage from the battery 450, based on at least the concentration of the gas. According to an embodiment, the processor 460 detects a variation according to time of gas leakage other than the absolute concentration of the gas leaking from the battery 450, and when the gas leakage from the battery 450 continues over a reference time, the processor 460 can determine the leakage is caused by aging of the battery 450.

In the operation 940, the processor 460 can control the operation of the electronic device 400 in correspondence to the concentration of the gas when determining that the concentration exceeds a predetermined threshold in the operation 930. According to an embodiment, when determining that the concentration exceeds the predetermined threshold, the processor 460 can decrease the charging current of the battery 450 under a reference value or stop charging of the battery 450.

Further, the processor 460 can provide a user interface (UI) giving notice that gas has leaked from the battery 450 through the display 430.

According to an embodiment, when gas leaks from the battery 450, problems such as a safety accident due to the battery 450, a problem with the waterproof and dustproof function of the electronic device, or reduction of the available time of the battery 450 may be generated, so the processor 460 can provide a user interface (UI) associated with the occurrence of gas leakage to the user of the electronic device 400 through the display 430. For example, the processor 460 can provide information of the amount of gas leaking from the battery 450, the type of gas leakage, the available time of the battery 450 according to gas leakage, whether the waterproof and dustproof function of the electronic device 400 can be supported, the necessity of replacing the battery 450, a possibility of damage and ignition of the battery 450, etc. to the user of the electronic device 400.

According to an embodiment, when gas leaking from the battery 450 is sensed by the gas sensor 412, the processor 460 can control at least some of the operation associated with charging of the battery 450. For example, when gas leaks from the battery 450, the processor 460 can prevent additional leakage of gas from the battery 450 by controlling at least some of the charging voltage, the charging current, and the charging amount of the battery 450 in accordance with the degree of gas leakage from the battery 450.

According to an embodiment, when gas leaking from the battery 450 is sensed by the gas sensor 412, the processor 460 can control the resolution of gas leakage. For example, when gas leaks from the electronic device 400, the gas sensing reference value of the gas sensor 412 increases and gas sensing becomes incorrect due to gas outside the electronic device 400, so the resolution for accurately sensing the leaking gas may be limited.

According to an embodiment, the processor 460 can increase the sensitivity of the gas sensor 412 to control the resolution of the gas sensor 412. For example, the electronic device 400 according to the disclosure can increase the gas sensing sensitivity to be able to more accurately sense gas by dividing the gas sensing section of the gas sensor 412 into 100 levels.

According to an embodiment, the processor 460 can decrease the sensitivity of the gas sensor 412 to control the resolution of the gas sensor 412. For example, the electronic device 400 according to the disclosure can maintain the difference due to sensitivity at a low level when sensing gas existing outside the electronic device even though the resolution decreases by decreasing the gas sensing section of 90 levels to 45 levels. Accordingly, it is possible to decrease the possibility of errors due to the battery 450 (e.g., the possibility of ignition of the battery 450) when using the electronic device 400.

According to an embodiment, the processor 460 can sense factors that influence the sensor value sensed and detected by the gas sensor 412, such as heat generation, humidity, and gas leakage from the battery 450, through the sensor module 410, and can control the resolution of the sensitivity of the gas sensor 412 using the lookup table stored in the memory 420 for the factors. For example, when heat generation is sensed by the sensor module 410 and is a predetermined level or more, it is possible to appropriately adjust the sensing sensitivity of the gas sensor 412 using the lookup table keeping a set resolution value of the gas sensor 412 which corresponds to the heat generation. Accordingly, it is possible to solve the problems due to incorrect sensing at high temperature by the gas sensor 412 of the electronic device 400.

Figure 17:
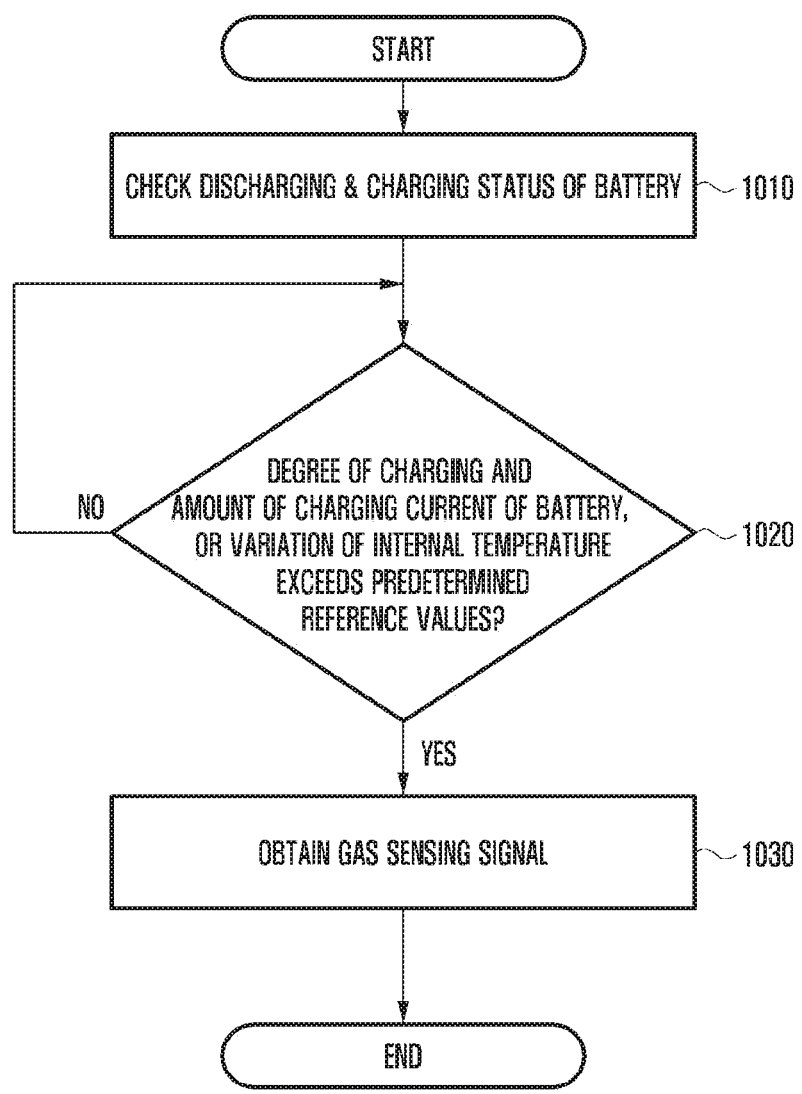
FIG. 17 is a flowchart showing a method for obtaining a gas sensing signal of an electronic device according to various embodiments of the disclosure.

FIG. 17 is a flowchart showing a method for obtaining a gas sensing signal of an electronic device according to various embodiments of the disclosure.

In the operation 1010, the processor 460 of the electronic device 400 can check the dustproof and charging statuses of the battery 450.

According to an embodiment, the processor 460 can check the charging amount, the charging voltage, the charging current, or a temperature variation of the battery 450.

In the operation 1020, the processor 460 can determine whether the degree of charging and the amount of charging current of the battery 450, and a variation of the internal temperature of the electronic device 400 exceed predetermined reference values.

According to an embodiment, the processor 460 can sense and determine that the electronic device 400 is charging the battery 450 with a high charging current, the temperature variation rapidly increases for a predetermined time, or the battery 450 is rapidly discharged.

In the operation 1030, the processor 460 can obtain a sensing signal of gas leaking from the battery 450 through the gas sensor 412 when determining that the degree of charging and the amount of charging current of the battery 450 and the variation of the internal temperature exceed the predetermined reference values in the operation 1020.

Figure 18:
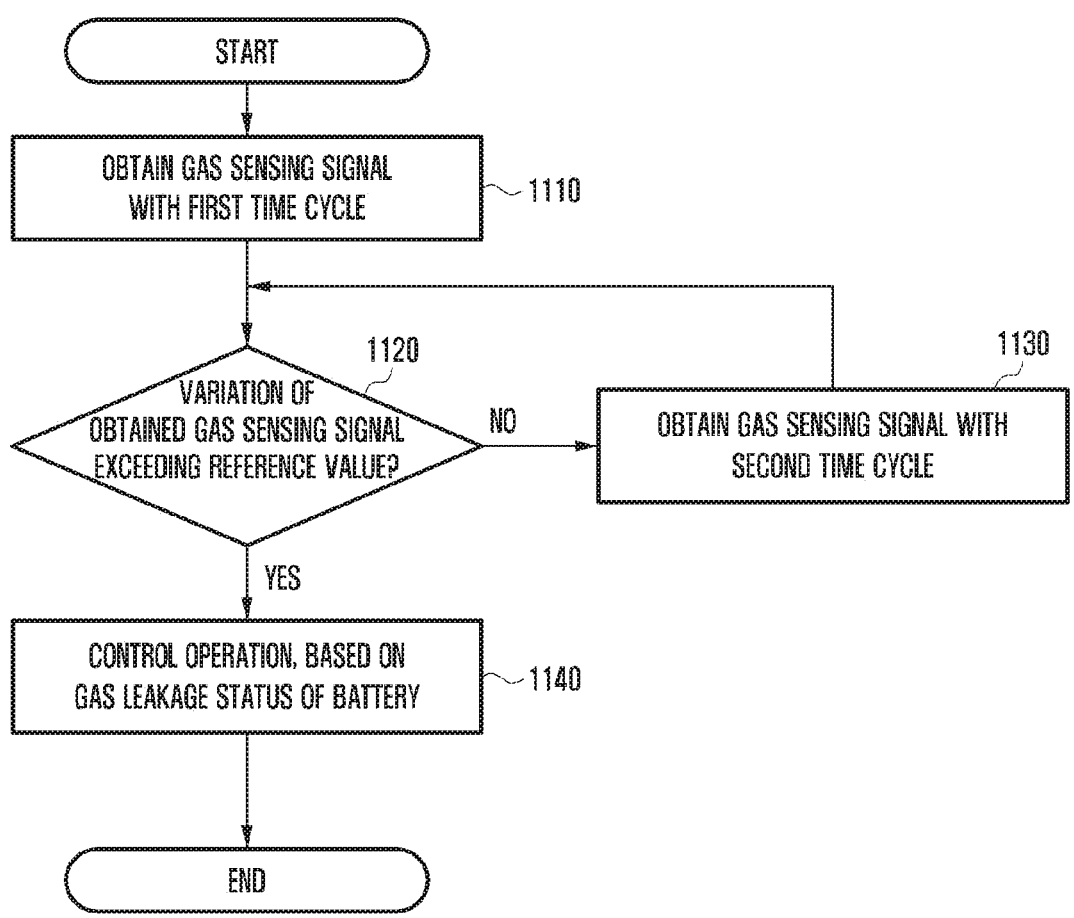
FIG. 18 is a flowchart showing a method for obtaining a gas sensing signal in accordance with a time period of an electronic device according to various embodiments of the disclosure and controlling a charging operation of a battery, based on a gas leakage status of the battery.

FIG. 18 is a flowchart showing a method for obtaining a gas sensing signal in accordance with a time period of an electronic device according to various embodiments of the disclosure and controlling a charging operation of a battery on the basis of a gas leakage status of the battery.

In the operation 1110, the processor 460 (or the gas sensor 412) of the electronic device 400 can obtain a gas sensing signal value by sensing gas with a first time cycle.

According to an embodiment, the processor 460 can check a gas sensing signal value from the gas sensor 412 with a cycle of a predetermined time to sense and detect gas leaking from the battery 450. According to an embodiment, the processor 460 (or the gas sensor 412) can change the checking cycle for the gas sensing signal value in accordance with the operation status of the electronic device 400. For example, the processor 460 (or the gas sensor 412) may obtain a gas sensing signal, for example, with a cycle of about 50 to 70 minutes when the display 430 is off. The processor 460 (or the gas sensor 412) may obtain a gas sensing signal, for example, with a cycle of about 8 to 12 minutes when the display 430 is on. The processor 460 (or the gas sensor 412) may obtain a gas sensing signal, for example, with a cycle of about 50 to 70 seconds when the battery 450 of the electronic device 400 is being charged.

According to an embodiment, the processor 460 (or the gas sensor 412) can change the gas sensing obtaining cycle in accordance with the operation status of an application that is used the electronic device 400. For example, when an application that generates a large amount of heat or consumes a large amount of the power of the battery 450 is executed, the processor 460 (or the gas sensor 412) can change the gas sensing obtaining cycle to be very short, for example, about 50 to 70 seconds. For example, when an application that generates a small amount of heat or consumes a small amount of the power of the battery 450 is executed, the processor 460 (or the gas sensor 412) can change the gas sensing obtaining cycle, for example, to be about 8 to 12 minutes.

In the operation 1120, the processor 460 can determine whether a variation of the gas sensing signal value obtained through the operation 1110 exceeds a predetermined threshold.

According to an embodiment, the processor 460 can determine whether the absolute concentration of gas sensed and detected by the gas sensor 412 exceeds a predetermined reference. The processor 460 can determine whether a variation according to a gas measurement cycle sensed and detected by the gas sensor 412 exceeds a predetermined reference.

According to an embodiment, the processor 460 can determine the type of gas leaking from the battery 450, at least partially based on the absolute concentration of the gas sensed and detected by the gas sensor 412 or the variation according to the measurement cycle of the gas. For example, the processor 460 can recognize and classify gas leakage from the battery 450 into a first battery gas leakage status (e.g., gas leakage due to internal leakage of the battery 450) or a second battery gas leakage status (e.g., gas leakage due to aging of the battery 450).

In the operation 1130, the processor 460 can obtain a gas sensing signal value by sensing gas with a second time cycle when determining that a variation of the obtained gas sensing signal value does not exceed the predetermined reference value.

According to an embodiment, the second time cycle may have a time interval larger than the first time cycle. For example, the processor 460 can sense the second battery gas leakage status by extending the gas sensing signal obtaining cycle of the gas sensor 412. In the second battery gas leakage status, gas leakage from the battery 450 may slowly occur.

In the operation 1140, the processor 460 can control the operation of the electronic device 400, based on the gas leakage status of the battery 450 when determining that a variation of the obtained gas sensing signal value exceeds the predetermined reference value in the operation 1120.

According to an embodiment, the processor 460 can control the operation of the electronic device 400 in accordance with the first battery gas leakage status when a variation of the gas sensing signal value sensed in accordance with the first time cycle exceeds a predetermined reference value. For example, the processor 460 can stop or block charging of the battery 450 or can minimize the full charging voltage and can minimize a discharge operation in the first battery gas leakage status. Further, the processor 460 can provide a user interface (UI) associated with damage or ignition of the battery 450 to the user of the electronic device 400.

According to an embodiment, the processor 460 can control the operation of the electronic device in accordance with the second battery gas leakage status when a variation of the gas sensing signal value sensed in accordance with the second time cycle exceeds a predetermined reference value. For example, the processor 460 can set at least one of the charging current and the full charging voltage of the battery 450 at a low level in the second battery gas leakage status. Further, the processor 460 can provide a user interface (UI) associated with reduction of the available time due to aging of the battery 450 to the user of the electronic device 400.

Therefore, the electronic device 400 according to various embodiments of the disclosure senses in real time gas leakage from the battery 450 due to exposure to high temperature or heat generation and controls the status of the battery 450, thereby being able to prevent a safety accident due to the battery 450.

Although the disclosure was described above with reference to various embodiments, it should be noted that the disclosure may be changed and modified by those skilled in the art without departing from the scope of the disclosure.

The invention claimed is:

1. An electronic device comprising:
   a housing;
   an accommodator disposed in the housing and including at least one gas sensor;
   a battery disposed in the housing;
   a display;
   a memory configured to store information of gas, which leaks from the battery, sensed by the at least one gas sensor and operation control information of the electronic device; and
   a processor electrically connected with the memory,
   wherein the processor is configured to:
   obtain a sensing signal of the gas leaking from the battery using the at least one gas sensor,
   control, when the obtained sensing signal of the gas exceeds a first threshold, the display to notify a user via a user interface that the obtained sensing signal of the gas has exceeded the first threshold, and
   block, when the obtained sensing signal of the gas exceeds a second threshold, signals for performing at least one function of the electronic device.

2. The electronic device of claim 1, wherein the accommodator including the at least one gas sensor has a first hole formed in a first direction and a second hole formed in a second direction,
   wherein the first hole is disposed at a position corresponding to a hole formed at the housing,
   wherein the second hole is disposed at a position corresponding to a hole formed at the battery,
   wherein the at least one gas sensor is configured to sense gas leaking from the hole of the battery and flowing inside through the second hole.

3. The electronic device of claim 2, wherein the second hole is configured to receive gas leaking through the hole formed at the battery and the first hole is configured to discharge the gas flowing inside through the second hole to the outside of the housing, and
   the second hole is larger in size than the first housing to receive gas leaking from the battery.

4. The electronic device of claim 2, wherein a first sealing member is disposed between the first hole and the hole formed at the housing,
   wherein a first pipeline is disposed between the accommodator and the first hole and a second pipeline is disposed between the accommodator and the second hole,
   wherein the second pipeline is shorter than the first pipeline so that gas leaking from the hole formed at the battery can flow faster inside.

5. The electronic device of claim 2, wherein the hole formed at the housing includes at least one of a microphone hole, a speaker hole, a connector hole, and a path of a smart pen.

6. The electronic device of claim 2, wherein when two gas sensors are provided, one of the gas sensors senses gas flowing inside through the first hole and the other one of the gas sensors senses gas leaking from the battery.

7. The electronic device of claim 1, wherein the accommodator further includes at least one of a temperature/humidity sensor, an air flow rate sensor, and a pressure sensor that sense environments inside and outside the electronic device.

8. The electronic device of claim 1, wherein the at least one sensor is composed of at least one cell to sense a kind or concentration of gas leaking from the battery.

9. An electronic device comprising:
   a housing;
   an accommodator disposed in the housing and including at least one gas sensor;
   a battery disposed in the housing;
   a display;
   a memory configured to store information of gas, which leaks from the battery, sensed by the at least one gas sensor and operation control information of the electronic device; and
   a processor electrically connected with the memory,
   wherein the accommodator including the at least one gas sensor has a first hole formed in a first direction and a second hole formed in a second direction,
   wherein the first hole is disposed at a position corresponding to a hole formed at the housing,
   wherein the second hole is disposed at a position corresponding to a hole formed at the battery,
   wherein the at least one gas sensor is configured to obtain a sensing signal of the gas leaking from the hole of the battery and flowing inside through the second hole, and
   wherein the processor is configured to:
   control, when the obtained sensing signal of the gas exceeds a first threshold, the display to notify a user via a user interface that the obtained sensing signal of the gas has exceeded the first threshold, and
   block, when the obtained sensing signal of the gas exceeds a second threshold, signals for performing at least one function of the electronic device.

10. The electronic device of claim 9, wherein the accommodator further includes at least one of a temperature/humidity sensor, an air flow rate sensor, and a pressure sensor that sense environments inside and outside the electronic device, and
    the hole formed at the housing includes at least one of a microphone hole, a speaker hole, a connector hole, and a path of a smart pen.

11. The electronic device of claim 9, wherein the second hole is configured to receive gas leaking through the hole formed at the battery and the first hole is configured to discharge the gas flowing inside through the second hole to the outside of the housing.

12. The electronic device of claim 9, wherein a first sealing member is disposed between the first hole and the hole formed at the housing, and
a first pipeline is disposed between the accommodator and the first hole and a second pipeline is disposed between the accommodator and the second hole.

13. The electronic device of claim 9, wherein the at least one sensor is composed of at least one cell to sense a kind or concentration of gas leaking from the battery.

14. A method for sensing and controlling a status of a battery disposed of an electronic device, the method comprising:
obtaining a sensing signal of gas leaking from the battery using at least one gas sensor by means of a processor of the electronic device;
controlling, when the obtained sensing signal of the gas exceeds a first threshold, a display to notify a user via a user interface that the obtained sensing signal of the gas has exceeded the first threshold, and
blocking, when the obtained sensing signal of the gas exceeds a second threshold, signals for performing at least one function of the electronic device.

* * * * *